(12) United States Patent
Walther

(10) Patent No.: US 7,591,408 B2
(45) Date of Patent: Sep. 22, 2009

(54) CAMERA-ASSISTED ADJUSTMENT OF BONDING HEAD ELEMENTS

(75) Inventor: Frank Walther, Brakel (DE)

(73) Assignee: Hess & Knipps GmbH (DE)

( * ) Notice: Subject to any disclaimer, the term of this patent is extended or adjusted under 35 U.S.C. 154(b) by 427 days.

(21) Appl. No.: 11/488,716

(22) Filed: Jul. 18, 2006

(65) Prior Publication Data

US 2006/0255097 A1 Nov. 16, 2006

Related U.S. Application Data

(60) Division of application No. 11/355,329, filed on Feb. 16, 2006, now Pat. No. 7,461,768, which is a continuation of application No. PCT/EP2004/008018, filed on Jul. 17, 2004.

(30) Foreign Application Priority Data

Aug. 21, 2003 (DE) .................................. 10338809

(51) Int. Cl.
*B23K 31/02* (2006.01)
*B23K 37/00* (2006.01)
(52) U.S. Cl. .................... 228/103; 228/1.1; 228/4.5; 228/8; 228/105
(58) Field of Classification Search .................. None
See application file for complete search history.

(56) References Cited

U.S. PATENT DOCUMENTS

| | | | | |
|---|---|---|---|---|
| 3,700,155 A | * | 10/1972 | Hermanns | .................... 228/6.2 |
| 3,838,274 A | * | 9/1974 | Doubek et al. | .............. 250/548 |
| 4,976,392 A | | 12/1990 | Smith et al. | |
| 5,330,089 A | | 7/1994 | Orcutt et al. | |
| 5,340,011 A | | 8/1994 | Sanchez | ..................... 228/4.5 |
| 5,474,224 A | * | 12/1995 | Nishimaki et al. | .......... 228/102 |
| 5,547,537 A | * | 8/1996 | Reynolds et al. | ............ 156/351 |
| 5,556,022 A | | 9/1996 | Orcutt et al. | |
| 6,046,431 A | * | 4/2000 | Beattie | .................. 219/124.34 |

(Continued)

FOREIGN PATENT DOCUMENTS

| | | | |
|---|---|---|---|
| DE | 4239039 | | 5/1994 |
| DE | 10133885 | | 3/2002 |
| JP | 05347326 | A * | 12/1993 |
| WO | 2005028150 | | 3/2005 |

OTHER PUBLICATIONS

International Search Report, Dec. 10, 2004, 2 pgs.

(Continued)

*Primary Examiner*—Kiley Stoner
(74) *Attorney, Agent, or Firm*—St. Onge Steward Johnston & Reens LLC

(57) ABSTRACT

The invention relates to a method which is used to carry out adjusting operations on a bond head, wherein a bond head element is positioned in relation to a reference element, especially an ultrasonic tool. According to the invention, at least the surrounding area of the reference element, especially the tip of the ultrasonic tool, is optically detected by means of a camera and is displayed in an image on a display device. A marking is superimposed in the display in order to facilitate positioning. The invention also relates to an ultrasonic bonder comprising a camera which is used to support the positioning of a bond head element. Said camera can optically detect at least the area surrounding the reference element, especially the tip of the ultrasonic tool.

20 Claims, 2 Drawing Sheets

U.S. PATENT DOCUMENTS

| | | | | |
|---|---|---|---|---|
| 6,226,074 B1* | 5/2001 | Fujisawa et al. | ............... | 355/53 |
| 6,449,516 B1* | 9/2002 | Kyomasu et al. | ............... | 700/58 |
| 6,464,126 B2* | 10/2002 | Hayata et al. | ............... | 228/105 |
| 6,467,673 B2* | 10/2002 | Enokido et al. | ............. | 228/105 |
| 6,516,990 B2 | 2/2003 | Hess et al. | | |
| 6,762,848 B2* | 7/2004 | Hayata et al. | ............... | 356/614 |
| 6,814,121 B2* | 11/2004 | Hayata et al. | ............... | 156/358 |
| 6,915,827 B2 | 7/2005 | Haraguchi | | |
| 7,324,216 B2* | 1/2008 | Hill | ............................ | 356/512 |
| 2001/0011669 A1* | 8/2001 | Hayata et al. | ............... | 228/103 |
| 2002/0008131 A1* | 1/2002 | Hess et al. | .................. | 228/105 |
| 2002/0104870 A1 | 8/2002 | Nogawa | ..................... | 228/4.5 |
| 2003/0019911 A1* | 1/2003 | Beatson et al. | ............. | 228/105 |
| 2004/0032398 A1* | 2/2004 | Ariel et al. | ................... | 345/168 |
| 2004/0060663 A1* | 4/2004 | Haraguchi | .................. | 156/349 |
| 2004/0261947 A1* | 12/2004 | Haraguchi | .................. | 156/351 |

OTHER PUBLICATIONS

Thesaurus.com, Relative [online]. Roget's New Millennium Thesaurus, First Edition (v 1.3.1), Lexico Publishing Group, LLC., 2007 [Retrieved on Mar. 26, 2007], Retrieved from the Internet:<URL:http://thesaurus.reference.com/browse/relative>.

* cited by examiner

CAMERA-ASSISTED ADJUSTMENT OF BONDING HEAD ELEMENTS

CROSS-REFERENCE TO RELATED APPLICATIONS

This application is a divisional of currently U.S. patent application Ser. No. 11/355,329, filed on Feb. 16, 2006, now U.S. Pat. No. 7,461,768 which is a continuation of International Patent Application No. PCT/EP2004/008018 filed on Jul. 17, 2004, which designates the United States and claims priority of German Patent Application No. 10338809.5 filed on Aug. 21, 2003.

FIELD OF THE INVENTION

The invention relates to a method and an apparatus for carrying out setting operations on a bonding head, in which a bonding head element is positioned relative to a reference element, such as for example an ultrasonic tool, in particular its tip.

BACKGROUND OF THE INVENTION

In the context of ultrasonic bonders which have a bonding head with an ultrasonic tool attached to it, for example for carrying out wire bonding, it is known that various bonding head elements have to be positioned relative to the ultrasonic tool and in particular relative to its tip.

By way of example, accurate positioning of a wire feed relative to the tip of the ultrasonic tool is required to ensure that the wire which is supplied is always located precisely beneath the tip of the ultrasonic tool, for example in a V-shaped groove. Accurate positioning of the wire feed relative to the tip of the ultrasonic tool is necessary to enable the production of wire bonds of perfect quality.

Also, if a separate blade is used to sever the bonding wire or to produce a desired breaking point, it is also necessary for such a blade to be accurately positioned relative to the ultrasonic tool.

It is known for positioning operations of this type to be performed manually by the user of an ultrasonic bonder. Experience has shown that this is subject to considerable inaccuracies, since the operating user is reliant upon his own senses to achieve sufficiently accurate positioning of these elements with respect to one another. However, in many cases manual positioning cannot be considered adequate, and consequently the quality of bonds can then leave something to be desired and/or specifically defective bonds may be produced.

SUMMARY OF THE INVENTION

It is an object of the invention to provide a method and/or an ultrasonic bonder by which accurate positioning of a bonding head element relative to a reference element, such as for example the ultrasonic tool, is made possible.

According to the method of the invention, this object is achieved by virtue of the fact that at least a region surrounding the reference element, in particular the tip of the ultrasonic tool, is optically captured by means of a camera and is displayed in an image on a display device, at least one marking being overlaid into the display as an auxiliary means for positioning bonding head elements.

A method according to the invention of this nature can be carried out, for example, by means of an ultrasonic bonder, which to assist with positioning of a bonding head element has a camera, by means of which at least a region around the reference element, e.g. the tip of the ultrasonic tool, can be optically captured. A camera of this type may be provided directly on the ultrasonic bonder or may form a separate device, so that even existing ultrasonic bonders can be retrofitted so as to carry out the method according to the invention.

The optical capture of at least a region around the reference element, such as, for example the tip of the ultrasonic tool, gives an enlarged image, which is displayed in particular on a display device, for example of the tip of the ultrasonic tool and the further bonding head elements disposed around it, such as for example a wire feed and/or a blade or other elements that are to be adjusted.

The capture and display of the corresponding image of the region around the reference element, in particular the tip of an ultrasonic tool, and a marking as auxiliary assistance relieves the work of an operator, who no longer has to rely on his own senses in observing the ultrasonic tool. In particular, a preferred enlarged representation achieves increased accuracy when positioning the elements with respect to one another, for which purpose according to the invention it is provided that a desired position, and therefore an optimum position of a bonding head element relative to the reference element, for example the ultrasonic tool, is represented by a marking in the image, which an operator can use for orientation purposes.

A bonding head element can be set in such a manner that it appears in the image in the desired position relative to the reference element, for example by virtue of the fact that an adjustment point on a bonding head element is brought into line with the marking. It is also possible to provide for the marking to reproduce the contour of the bonding head element that is to be adjusted and for the bonding head element to be positioned into this contour.

It is preferably also possible to provide for a marking to be presented in the form of a tolerance field in the image relative to the reference element, in particular relative to the tip of the ultrasonic tool. Displaying a tolerance field provides the user with access to a region into which the bonding head element that is to be set is to be positioned. By way of example, it is then possible for a distinctive location on the bonding head element, e.g. its tip, to be positioned into this tolerance field. In this case, a tolerance field may be provided, for example, within the image in the form of a rectangular representation of parallel lines, or if appropriate just by two parallel lines, or if there are no tolerances, by a cross.

Particular accuracy in terms of the positioning can be effected from the location, in the image, of a tolerance field or any marking which represents a desired position of a bonding head element being determined by a data processing unit as a function of the location of the reference element or a reference point, in particular the tip of the ultrasonic tool in the image.

Therefore, the position of the adjustment marking, e.g. the tolerance field, can be determined on a computer-aided basis using internal criteria of the ultrasonic bonder, so that all the operator has to do is to position the bonding head element that is to be positioned with respect to the marking by operating suitable adjustment means.

To allow an adjustment marking e.g. of the tolerance field to be presented as a function of the location of the reference element, such as for example the tip of the ultrasonic tool, in an alternative it is possible to provide for the location of the reference element to be determined manually, in particular by marking this location in the image. To effect this, it is possible, for example, to provide for an operator to mark the corresponding location of a reference element, i.e. a reference point, in the image presented on the display device, for example by clicking on the tip or an edge of the tip of the ultrasonic tool by means of a mouse pointer. A marking can also be produced by touching a touchscreen of the display device or by other suitable measures for communicating the location of the reference element to the data processing unit.

This marking can be used, for example, to capture the precise position of the tip of the ultrasonic tool by computer means in order then to determine the optimum position for the adjustment marking, e.g. the tolerance field, as a function of this position and to present it in the image on the display device.

According to a further alternative, it is also possible to provide for the location of the reference element, e.g. the tip of the ultrasonic tool, to be determined by computer-aided image recognition. For example, a computer program can be used to carry out pattern recognition in order to recognize the reference element, such as the tip of the ultrasonic tool, in the image captured and to determine the position. Then, based on this automatically computer-aided position recognition, it is possible to calculate the optimum position of the adjustment marking, e.g. the tolerance field in the image, in order for this position then to be incorporated into the image.

The positioning of any bonding head element, such as for example a wire guide or a blade, preferably has to be implemented optimally or within acceptable tolerances in all three dimensions. If at least the region around the tip of an ultrasonic tool is captured, in each case only a two-dimensional image can ever be formed, and consequently in each case only two-dimensional optimum positioning of the elements with respect to one another can be achieved in any one adjustment step.

To allow optimum positioning of a bonding head element relative to the reference element, such as the ultrasonic tool, at least initially in two dimensions, according to the invention it is possible to provide that the camera records at least one side view onto the reference element, therefore for example at least onto the tip of the ultrasonic tool, and/or a view onto the reference element perpendicularly with respect thereto, such as for example onto the end face of the tip of the ultrasonic tool. In particular when both options have been completed, the result is two different views from directions that are perpendicular to one another, so that ultimately a bonding head element can be positioned optimally with respect to all three dimensions.

To allow the view onto the reference element, e.g. onto the tip of the ultrasonic tool, in the different directions, it is preferably possible to provide that to change between the views a mirror is positioned in the beam path between the camera and the reference element. This mirror is preferably set up in such a manner that the beam path between the camera and the reference element, such as the tip of the ultrasonic tool, is diverted by 90° when the mirror is used.

In this case, to change from the lateral view of the reference element, in which for example the tip of the ultrasonic tool is located preferably precisely at the height of the optical axis of the camera, to a view onto the reference element, e.g. onto the end face, it is possible for the bonding head and therefore the reference element to be displaced in the Z direction and preferably at the same time parallel to the optical axis of the camera relative to the latter, in particular in such a way that the length of the beam path remains constant.

Therefore, when considering the overall installation, in which the bonding head is located above the camera following this displacement, a mirror can be moved at a 45 degree orientation under the reference element, e.g. under the tip of the ultrasonic tool, in order thereby for the beam path to be correspondingly diverted and to allow an undisturbed view for example onto the end face and in particular the groove of the ultrasonic tool.

With the method according to the invention and the ultrasonic bonder according to the invention, there is preferably provision for both a wire guide and a blade to be positioned relative to the tip of an ultrasonic tool. In principle, however, it is possible for any conceivable element on a bonding head to be positioned relative to any desired reference element or any desired reference point.

Since the light conditions in the region around the bonding head elements to be observed may be inadequate, it is possible to additionally provide, in a refinement, that the bonding head elements that are to be adjusted are artificially illuminated in order for the image to be captured. In particular, light-emitting diodes, which are preferably disposed around the camera objective, can be used for this purpose.

BRIEF DESCRIPTION OF THE DRAWINGS

An exemplary embodiment of the invention is illustrated in the drawings below, in which.

DETAILED DESCRIPTION OF THE INVENTION

Figure 1:
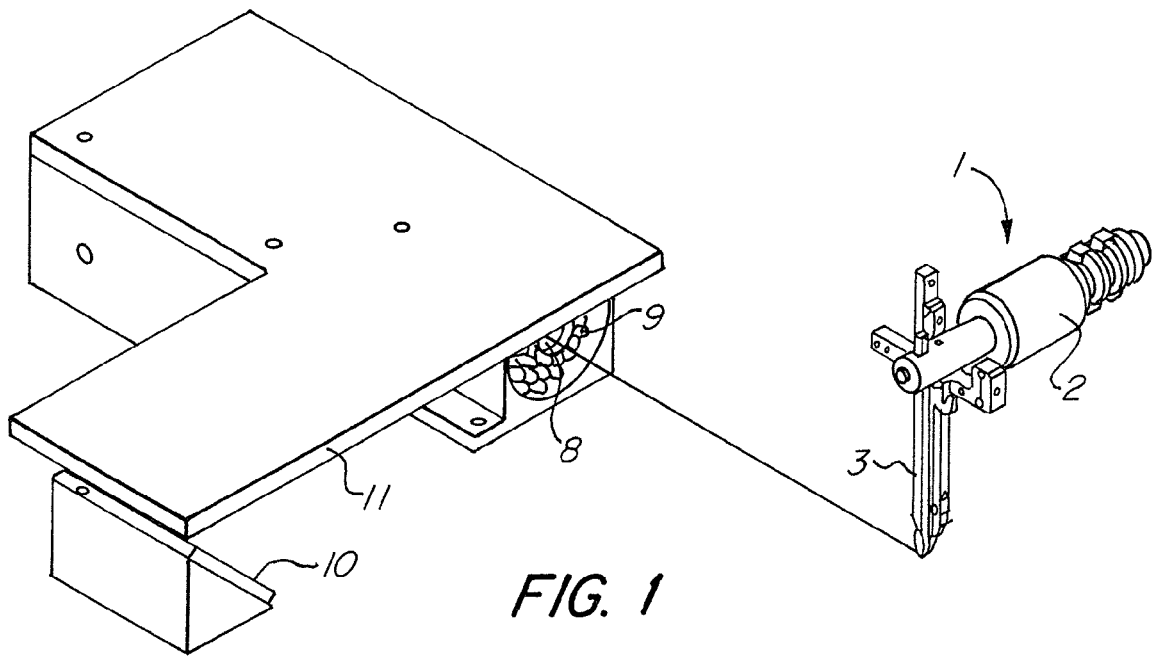
FIG. 1 shows part of an ultrasonic bonder with a bonding head provided on it and a camera for visual observation of the tip of the ultrasonic tool.

FIG. 1 shows a partial excerpt from an ultrasonic bonder with a bonding head 1 which is disposed thereon and in the usual way includes an ultrasonic transducer 2 which is provided on it and to which an ultrasonic tool in the form of a wedge 3 is secured. Furthermore, at the ultrasonic bonder, a camera 8, which in the illustration shown in FIG. 1 records a lateral view of the tip or the region around the tip of the ultrasonic tool 3, is provided on a corresponding holder.

Figure 2:
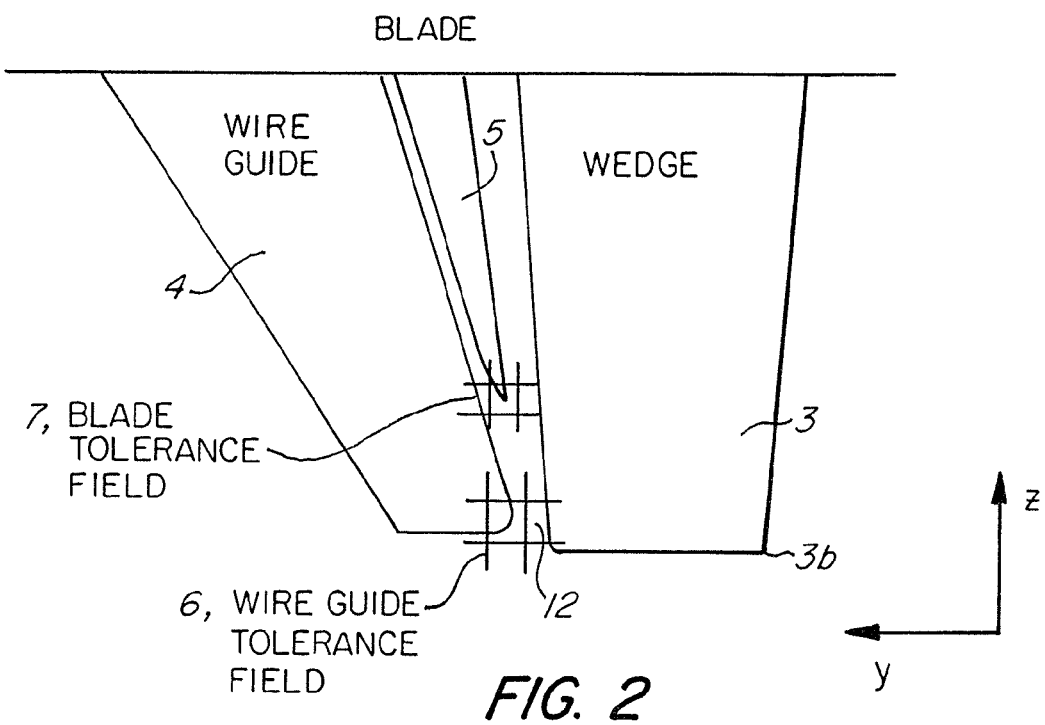
FIG. 2 presents a lateral image, captured by the camera, of the tip of the ultrasonic tool and its vicinity together with further bonding head elements.

FIG. 2 shows a corresponding lateral image which can be viewed by a user on the display device of the camera, for example a screen. The relative arrangement of the wire guide 4 for supplying a wire 12 to the tip 3b of the ultrasonic tool 3 and of the blade 5 disposed between these elements with respect to the ultrasonic tool 3 can be clearly seen.

According to the invention, it is possible to provide that a user marks the front edge 3b of the tip of the ultrasonic tool, for example using a mouse pointer, in order to communicate the position of the tip to a data processing unit. According to another embodiment, it is possible to provide that this position is determined automatically by pattern recognition.

On account of the position of the tip 3b of the ultrasonic tool 3 having been predetermined in this way, the data processing unit is able to calculate optimum positioning both of the wire guide 4 and also, in this embodiment, of the blade tip 5 by taking account of internal criteria. In the present case, this optimum position for the wire guide 4 is presented in the form of a corresponding tolerance field 6 within the image. The optimum position for the positioning of the blade tip 5 is also overlaid into the image by way of a tolerance field 7.

In order then to achieve an optimum position of these elements 4, 5, a user, for example by operating suitable setting mechanisms, can dispose the respective tips of both the wire guide 4 and the blade 5 within the tolerance fields 6, 7 presented, which in this case are substantially rectangular in form.

In a further embodiment, it is also possible to provide that the data processing unit effects positioning of the bonding head elements automatically by corresponding control of the setting mechanisms. In such a case, the relative positioning of these elements can be effected fully automatically.

The embodiment shown in FIGS. 1 and 2, with a side view, only allows the positioning of the wire guide 4 and the blade 5 in two dimensions, namely the Y and Z directions based on FIG. 2.

To also achieve optimum positioning with regard to the remaining dimension in the X direction, according to the present embodiment there is provision for the beam path to be diverted by a mirror 10, which can be effected for example by introducing a mirror 10 which is tilted at 45° on a holding arm 11 into the beam path after the bonding head 1 has been displaced in the Z direction and parallel to the optical axis of the camera, so that the diverted beam path now provides the camera with a view onto the end face of the tip of the ultrasonic tool 3.

Figure 3:
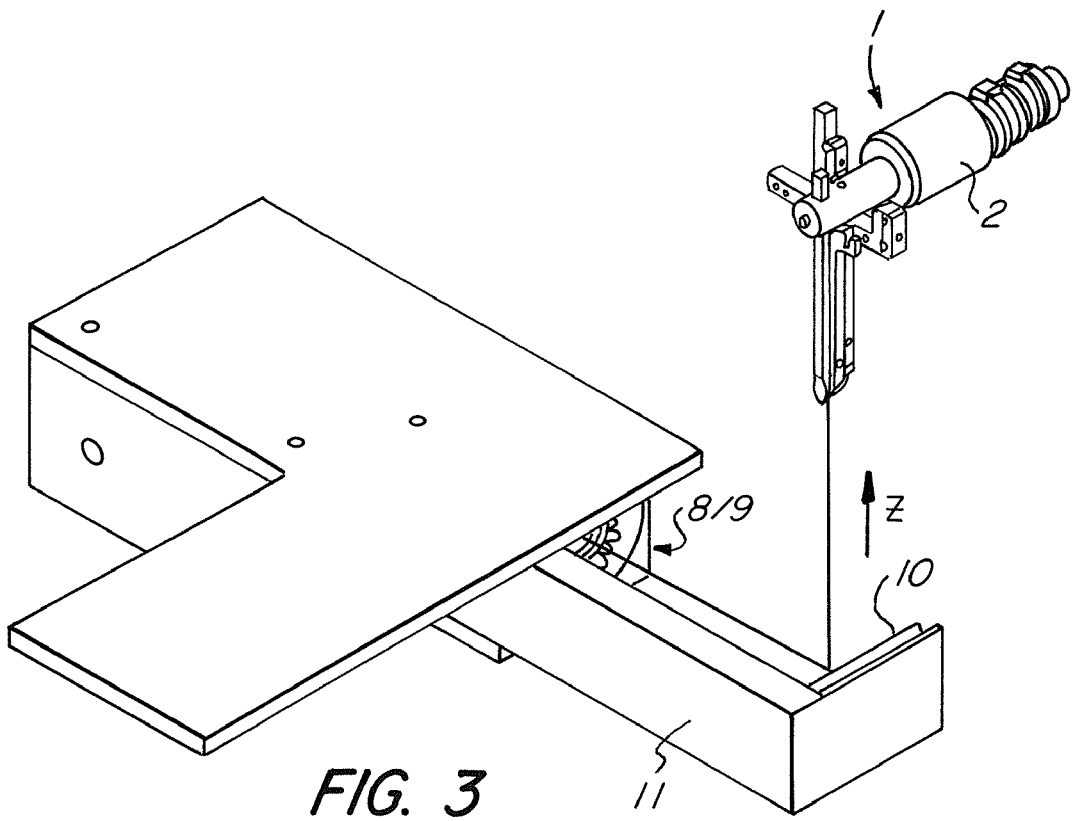
FIG. 3 shows a camera arrangement relative to the tip of the ultrasonic tool using a mirror to divert the beam path.
Figure 4:
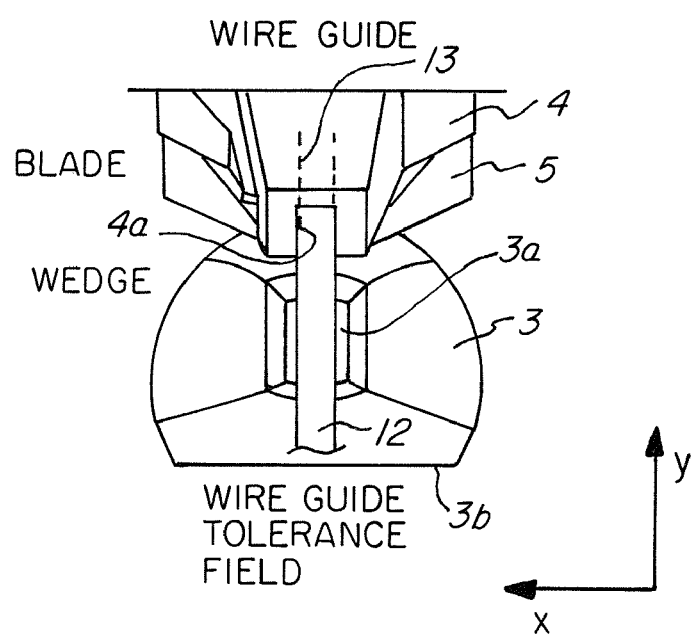
FIG. 4 shows an image, captured by the camera, of the tip of an ultrasonic tool and its vicinity in the form of a view onto the end face of the tip.

An arrangement as shown in FIG. 3 therefore results in an image corresponding to FIG. 4 in the X-Y plane, in which in addition to the V-shaped groove 3a in the tip of the ultrasonic tool 3, the respective tips of the wire guide 4 and the blade 5 can also be recognized. In particular, in this case the groove 4a in the wire guide 4 can be recognized; this groove is used to feed a wire 12 under the V-shaped groove 3a in the ultrasonic tool 3.

Optimum positioning is achieved if the course of the groove 4a of the wire guide 4 is aligned with the V-shaped groove 3a in the ultrasonic tool 3, in order for the wire 12 to be supplied without disruption.

To find this positioning, it is in turn possible to provide for the position to be determined on the basis of a distinctive location on the tip of the ultrasonic tool, for example at the edge 3b, either manually by the user or by pattern recognition by a computer. As a function of this position determination, a marking or a tolerance field 13, in this case for example in the form of two parallel lines, can be superimposed on the image, in order thereby to allow optimum positioning of the groove 4a of the wire guide 4. This positioning is achieved when the side walls of the groove 4a are aligned with the lines of the tolerance field 13 as illustrated in FIG. 4.

Therefore, in particular by diverting the beam path by means of a mirror 10, it is possible to achieve optimum positioning of the bonding head elements, for example a wire guide and a blade, relative to the tip of an ultrasonic tool in all three dimensions.

Should the light conditions prove inadequate, it is possible, as illustrated here, for light-emitting diodes 9 to be disposed around the camera objective, providing for sufficient illumination in the vicinity of the tip of the ultrasonic tool 3.

What is claimed is:

1. Method for carrying out setting operations on a bonding head, as part of which setting operations a bonding head element is positioned relative to a reference element, the bonding head element and the reference element each being within and comprising part of the bonding head, characterized in that at least a region surrounding the reference element is optically captured by means of a camera and is displayed in an image on a display device, a marking being overlaid into the display as an auxiliary means for providing assistance with the positioning.

2. Method according to claim 1, characterized in that the bonding head element is set in such a manner that it appears in the image in a desired position, corresponding to the marking, relative to the reference element.

3. Method according to claim 2, characterized in that the marking is presented in the form of a tolerance field in the image relative to the reference element.

4. Method according to claim 3, characterized in that the location of a tolerance field in the image is determined by a data processing unit as a function of the location of the reference element in the image.

5. Method according to claim 1, characterized in that the location of the reference element is determined manually.

6. Method according to claim 1, characterized in that to position the bonding head element, there is recorded by the camera at least one view onto the reference element.

7. Method according to claim 5, characterized in that to change between views, a mirror is positioned in the beam path between camera and reference element.

8. Method according to claim 6, characterized in that to record a view onto the reference element, the bonding head is displaced in the Z direction and parallel to the optical axis of the camera.

9. Method according to claim 1, characterized in that at least one of the bonding head element, a wire guide a blade is positioned relative to a tip of an ultrasonic tool.

10. Method according to claim 1, characterized in that the bonding head elements are artificially illuminated in order to capture the image.

11. Method according to claim 1, characterized in that the reference element comprises an ultrasonic tool.

12. Method according to claim 11, characterized in that a tip of the ultrasonic tool is optically captured by means of the camera and is displayed in the image on the display device.

13. Method according to claim 5, characterized in that the location of the reference element is determined manually by marking in the image.

14. Method according to claim 5, characterized in that the location of the reference element is determined manually by computer-aided image recognition.

15. Method according to claim 6, characterized in that to position the bonding head element, there is recorded by the camera at least one side view onto the tip of the ultrasonic tool.

16. Method according to claim 6, characterized in that to position the bonding head element, there is recorded by the camera at least view onto an end face of the tip of the ultrasonic tool.

17. Method according to claim 8, characterized in that the bonding head is displaced in such a manner that the focus distance remains constant.

18. Method according to claim 10, characterized in that the bonding head elements are artificially illuminated by light-emitting diodes disposed around a camera objective.

19. Method for carrying out setting operations on a bonding head, as part of which setting operations a bonding head element is positioned relative to a reference element, characterized in that at least a region surrounding the reference element is optically captured by means of a camera and is displayed in an image on a display device, a marking being overlaid into the display as an auxiliary means for the positioning, characterized in that the reference element comprises an ultrasonic tool.

20. Method according to claim 19, characterized in that a tip of the ultrasonic tool is optically captured by means of the camera and is displayed in the image on the display device.

* * * * *

UNITED STATES PATENT AND TRADEMARK OFFICE
CERTIFICATE OF CORRECTION

PATENT NO.        : 7,591,408 B2
APPLICATION NO.   : 11/488716
DATED             : September 22, 2009
INVENTOR(S)       : Walther Page 1 of 1

It is certified that error appears in the above-identified patent and that said Letters Patent is hereby corrected as shown below:

On title page change item (73) as follows:

Item (73) Assignee: Hesse & Knipps GmbH (DE)

Signed and Sealed this

Twenty-ninth Day of December, 2009

David J. Kappos
*Director of the United States Patent and Trademark Office*